United States Patent
Kusuda et al.

(10) Patent No.: US 7,764,118 B2
(45) Date of Patent: Jul. 27, 2010

(54) AUTO-CORRECTION FEEDBACK LOOP FOR OFFSET AND RIPPLE SUPPRESSION IN A CHOPPER-STABILIZED AMPLIFIER

(75) Inventors: Yoshinori Kusuda, Woburn, MA (US); Thomas L. Botker, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/378,204

(22) Filed: Feb. 11, 2009

(65) Prior Publication Data

US 2010/0060352 A1 Mar. 11, 2010

Related U.S. Application Data

(60) Provisional application No. 61/191,919, filed on Sep. 11, 2008.

(51) Int. Cl.
*H03F 1/02* (2006.01)
(52) U.S. Cl. ........................... 330/9; 327/124
(58) Field of Classification Search ............ 330/9; 327/124, 307
See application file for complete search history.

(56) References Cited

U.S. PATENT DOCUMENTS

| | | | |
|---|---|---|---|
| 3,597,696 A * | 8/1971 | Rabindran | 330/10 |
| 5,206,602 A | 4/1993 | Baumgartner et al. | 330/9 |
| 5,621,319 A | 4/1997 | Bilotti et al. | 324/251 |
| 7,209,000 B2 * | 4/2007 | Huijsing et al. | 330/9 |
| 7,292,095 B2 | 11/2007 | Burt et al. | 330/9 |
| 7,573,327 B1 * | 8/2009 | Pertijs et al. | 330/9 |
| 2002/0097081 A1 | 7/2002 | Razavi et al. | |
| 2003/0189461 A1 | 10/2003 | Huijsing et al. | |
| 2006/0176109 A1 | 8/2006 | Huijsing et al. | |

OTHER PUBLICATIONS

PCT Notification of the International Search Report and the Written Opinion of the International Searching Authority, dated Dec. 10, 2009; for International Application No. PCT/US2009/004988.
Makinwa, Kofi; "T4: Dynamic-Offset Cancellation Techniques in CMOS"; ISSCC 2007; pp. 2 and 49.

(Continued)

*Primary Examiner*—Henry K Choe
(74) *Attorney, Agent, or Firm*—Koppel, Patrick, Heyhl & Dawson (57) ABSTRACT

A chopper-stabilized amplifier includes a main signal path having first and second chopping circuits at the inputs and outputs of a transconductance amplifier, and an auto-correction feedback loop. The feedback loop includes a transconductance amplifier connected to amplify the chopped output from the main signal path, a third chopping circuit which chops the amplified output, a filter which filters the chopped output to substantially reduce any offset voltage-induced AC component present in the signal being filtered, and a transconductance amplifier which receives the filtered output and produces an output which is coupled back into the main signal path. When properly arranged, the auto-correction feedback loop operates to suppress transconductance amplifier-related offset voltages and offset voltage-induced ripple that might otherwise be present in the amplifier's output.

12 Claims, 7 Drawing Sheets

OTHER PUBLICATIONS

Bakker, A. et al.; "A CMOS Chopper Opamp with Integrated Low-Pass Filter", Electronic Instrumentation Laboratory; Department of Electrical Engineering; Delft University of Technology; The Netherlands, 4 pps.

Bilotti, Alberto at al.; "Chopper-Stabilized Amplifiers with a Track-and-Hold Signal Demodulator"; IEEE Transactions on Circuits and Systems-1; Fundamental Theory and Applications; vol. 46; No. 4; Apr. 1999; pp. 490-495.

Burt, Rod at al.; "A Micropower Chopper-Stabilized Operational Amplifier Using a SC Notch Filter with Synchronous Integration Inside the Continuous-Time Signal Path"; 2006 IEEE International Solid-State Circuits Converence; Session 19; Analog Techniques; 19.6; 10 pp.

* cited by examiner

AUTO-CORRECTION FEEDBACK LOOP FOR OFFSET AND RIPPLE SUPPRESSION IN A CHOPPER-STABILIZED AMPLIFIER

RELATED APPLICATIONS

This application claims the benefit of provisional patent application No. 61/191,919 to Yoshinori Kusuda and Thomas L. Botker, filed Sep. 11, 2008.

BACKGROUND OF THE INVENTION

1. Field of the Invention

This invention relates generally to chopper-stabilized amplifiers, and more particularly, to means for reducing offset and ripple in such amplifiers.

2. Description of the Related Art

Operational amplifiers are ubiquitous in electronic circuitry. In some applications, it is essential that an op amp have a very low input offset voltage. Two techniques are commonly employed to achieve this: auto-zeroing and chopper-stabilizing. However, both of these techniques have drawbacks. For example, auto-zeroing can result in increased in-band noise due to aliasing, whereas chopper-stabilizing can result in ripple at the chopping frequency appearing in the output voltage.

Figure 1:
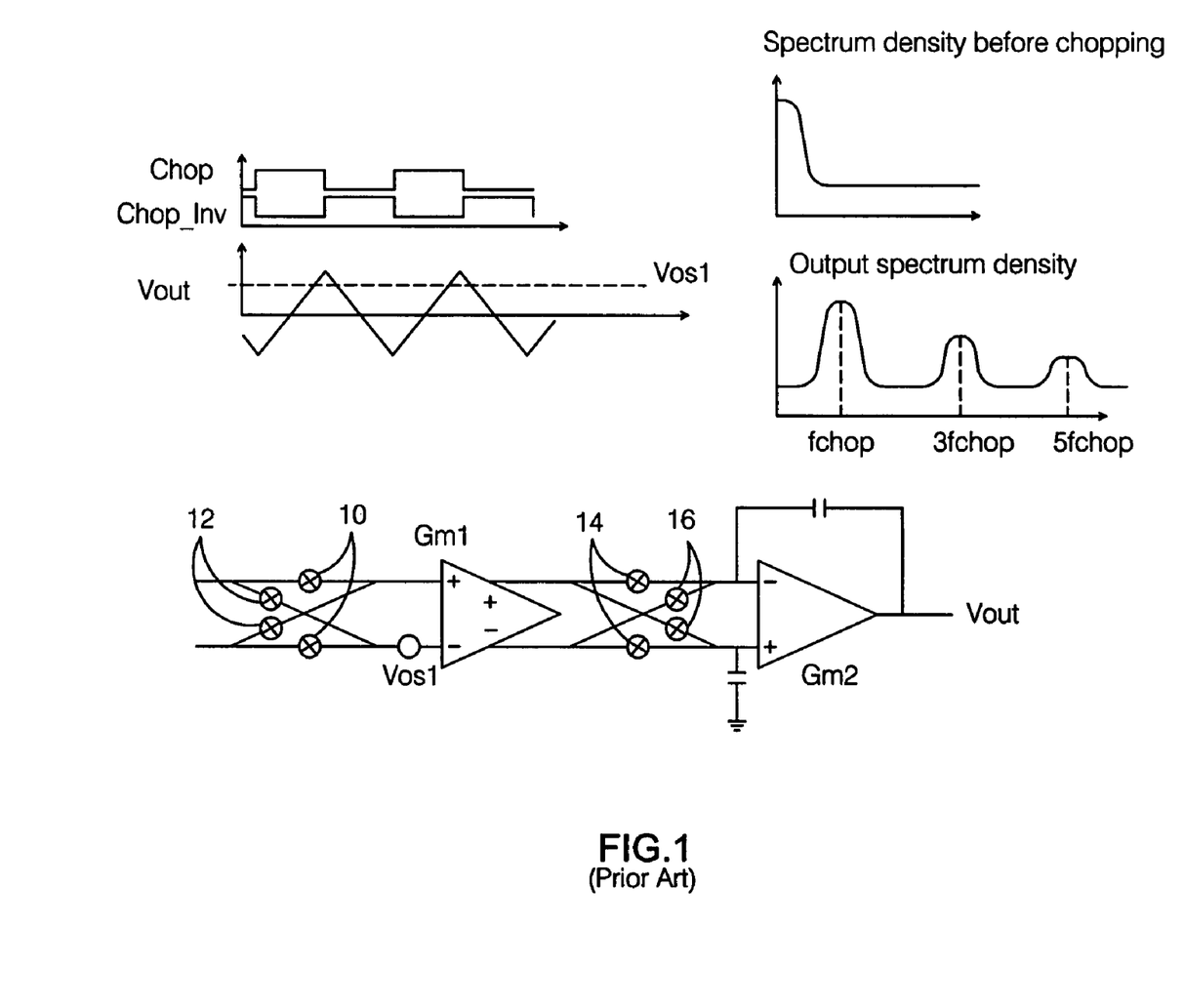
FIG. 1 is a schematic diagram of a known chopper-stabilized amplifier.

A conventional chopper-stabilized amplifier is shown in FIG. 1. A set of chopping switches 10, 12 chop the input applied to a transconductance amplifier Gm1, a set of chopping switches 14, 16 chop the output of Gm1, and an output amplifier Gm2 integrates the chopped output of Gm1 to produce the amplifier's output Vout. The chopping switches are operated with complementary clock signals "Chop" and "Chop_Inv"; switches 10 and 14 are closed and switches 12 and 16 are open when "Chop" is high, and switches 10 and 14 are open and switches 12 and 16 are closed when "Chop_Inv" is high. Ideally, the input offset voltage of Gm1 is zero, in which case chopping switches 10 and 12 convert the input voltage to an AC signal, and switches 14 and 16 convert the AC signal back to DC, such that no ripple is present in Vout. However, in practice, Gm1 will have a non-zero input offset voltage, represented in FIG. 1 as a voltage Vos1. This results in a ripple voltage being induced in Vout, with frequency components appearing in the output spectrum at the frequency of the chopping clocks and multiples thereof (as shown in FIG. 1).

Several methods have been used to reduce chopping-related ripple associated with a chopper-stabilized amplifier. One method, described in A. Bakker and J. H. Huijsing, "A CMOS Chopper Opamp with Integrated Low-Pass Filter", Proc. ESSCIRC, 1997, employs a sample-and-hold (S/H) circuit in the signal path; ripple is reduced by sampling the signal every time the waveform crosses zero. However, the S/H circuit adds an additional pole to the amplifier's frequency response, and makes frequency compensation difficult.

Another approach is discussed in U.S. Pat. No. 7,292,095 to Burt et al., in which a switched capacitor notch filter is inserted into the amplifier's signal path following the chopping switches, with the filter operated so as to reduce ripple. However, ripple present on the input side of the filter can be coupled to the amplifier's output via a compensation capacitor.

Yet another technique uses a feedback loop to suppress ripple in the signal path that arises due to an input offset voltage associated with the transconductance amplifier which receives the chopped input signal; this approach is illustrated, for example, in K. A. A. Makinwa, "T4: Dynamic Offset-Cancellation Techniques in CMOS", ISSCC 2007, p. 49. However, no means is provided to suppress an input offset voltage associated with the loop's feedback amplifier.

SUMMARY OF THE INVENTION

A chopper-stabilized amplifier with an auto-correction feedback loop is presented which overcomes a number of the problems described above, in that the feedback loop operates to suppress both input offset voltage effects and offset voltage-induced ripple that would otherwise appear in the amplifier's output.

The present chopper-stabilized amplifier includes a main signal path which includes an input chopping circuit that chops a differential input signal in response to a chopping clock, a first transconductance amplifier which receives the chopped input signal and produces a first differential output in response, an output chopping circuit which chops the first differential output in response to the chopping clock, and a second transconductance amplifier which receives the chopped first differential output and produces an output that varies in response.

The auto-correction feedback loop includes a third transconductance amplifier which is preferably connected to receive the chopped first differential output at its input and which produces a third differential output in response, a third chopping circuit which chops the third differential output in response to the chopping clock, a filter arranged to filter the chopped third differential output so as to substantially reduce any offset voltage-induced AC component present in the signal, and a fourth transconductance amplifier which receives the filtered output at its input and produces a fourth differential output in response. The fourth differential output is the output of the feedback loop, and is coupled to the first differential output, and thereby into the main signal path. When properly arranged, the auto-correction feedback loop operates to suppress transconductance amplifier-related offset voltages and offset voltage-induced ripple that might otherwise be present in the amplifier's output.

The filter is preferably a switched capacitor notch filter clocked with a clock signal having the same frequency as, but which is phase-shifted 90 degrees with respect to, the chopping clock; however, other types of filters could also be used.

These and other features, aspects, and advantages of the present invention will become better understood with reference to the following drawings, description, and claims.

DETAILED DESCRIPTION OF THE INVENTION

Figure 2:
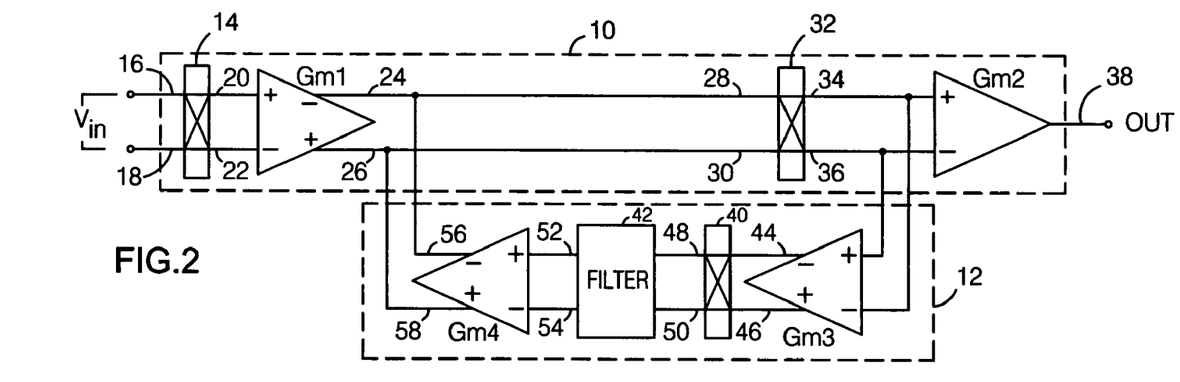
FIG. 2 is a block/schematic diagram of one possible embodiment of a chopper-stabilized amplifier with an auto-correction feedback loop in accordance with the present invention.

The present chopper-stabilized amplifier employs a novel auto-correction feedback loop, which operates to suppress transconductance amplifier-related offset voltages and offset voltage-induced ripple that might otherwise appear in the amplifier's output. A block/schematic diagram of one possible embodiment is shown in FIG. 2. The amplifier includes a main signal path 10 and an auto-correction feedback loop 12. The main signal path includes an input chopping circuit 14 which receives a differential input signal $V_{in}$. Chopping circuit 14, and all other chopping circuits described herein, operate in the same manner: during a first phase of a two-phase chopping clock, input terminals 16 and 18 are connected to output terminals 20 and 22, respectively; during the second clock phase, input terminals 16 and 18 are connected to output terminals 22 and 20, respectively. Chopping circuits such as chopping circuit 14 are typically made from four switches as illustrated in FIG. 1; the symbol used in FIG. 2 for the chopping circuit is commonly used to designate this four-switch arrangement. Though not shown in FIG. 2, chopping circuit 14 and all other chopping circuits are operated with a chopping clock (not shown in FIG. 2, but depicted in the timing diagrams discussed below).

Chopping circuit 14 chops input signal $V_{in}$ in response to the chopping clock, with the resulting chopped signal provided at the chopping circuit's output terminals 20 and 22. A first transconductance amplifier Gm1 is connected to receive the outputs of chopping circuit 14 at respective differential inputs, and to produce a first differential output 24, 26 which varies with the signal applied at its input. Differential output 24, 26 is applied to the input terminals 28, 30 of an output chopping circuit 32, which chops the first differential output in response to the chopping clock and provides the chopped first differential output signal at its output terminals 34, 36. The output of chopping circuit 32 is applied to the input terminals of a second transconductance amplifier Gm2, which produces an output 38 that varies with the signal applied at its input. In practice, output 38 would typically be delivered to an output stage to form a complete chopper-stabilized operational amplifier; this is discussed below in relation to FIG. 8.

As noted above, ideally, the input offset voltage of Gm1 is zero, in which case chopping circuit 14 converts input voltage $V_{in}$ to an AC signal, and chopping circuit 32 converts the AC signal back to DC, such that no ripple is present in the output 38. However, in practice, Gm1 typically has a non-zero input offset voltage (Vos1), which results in a ripple voltage being induced in the output voltage, with frequency components appearing in the output spectrum at the frequency of the chopping clock and multiples thereof.

This present chopper-stabilized amplifier overcomes this problem with the use of auto-correction feedback loop 12. For the exemplary embodiment shown, the auto-correction feedback loop comprises a third transconductance amplifier Gm3, a third chopping circuit 40, a filter 42 and a fourth transconductance amplifier Gm4. Gm3 is connected to receive the output of chopping circuit 32 at its differential inputs, and produces a third differential output 44, 46 that varies with the signal applied at its input. This output is applied to third chopping circuit 40, which chops the third differential output in response to the chopping clock and provides the chopped signal at its output terminals 48, 50.

Filter 42 is arranged to receive and filter the chopped third differential output so as to substantially reduce the AC component that may be present in the chopped third differential output signal due to ripple induced by offset voltages associated with transconductance amplifiers Gm1 and Gm4, and to provide the filtered version of the third chopping circuit's output at its output terminals 52, 54. Fourth transconductance amplifier Gm4 receives the filtered signal at its inputs and produces a fourth differential output 56, 58 that varies with the signal applied at its input. Gm3 and Gm4 also help to isolate filter 42 from the main signal path, which might otherwise be adversely affected by the load presented the filter. The feedback loop is closed by coupling fourth differential output 56 and 58 to the first differential output 24 and 26, respectively. When properly arranged, auto-correction feedback loop 12 operates to suppress offset voltages associated with transconductance amplifiers Gm1 and Gm4 and offset voltage-induced ripple that might otherwise be present in the output of chopping circuit 32, and thereby in Gm2 output 38. Filter 42 is preferably a switched capacitor notch filter (SCNF), though other filter types, such as a low-pass filter, could also be used.

Figure 3:
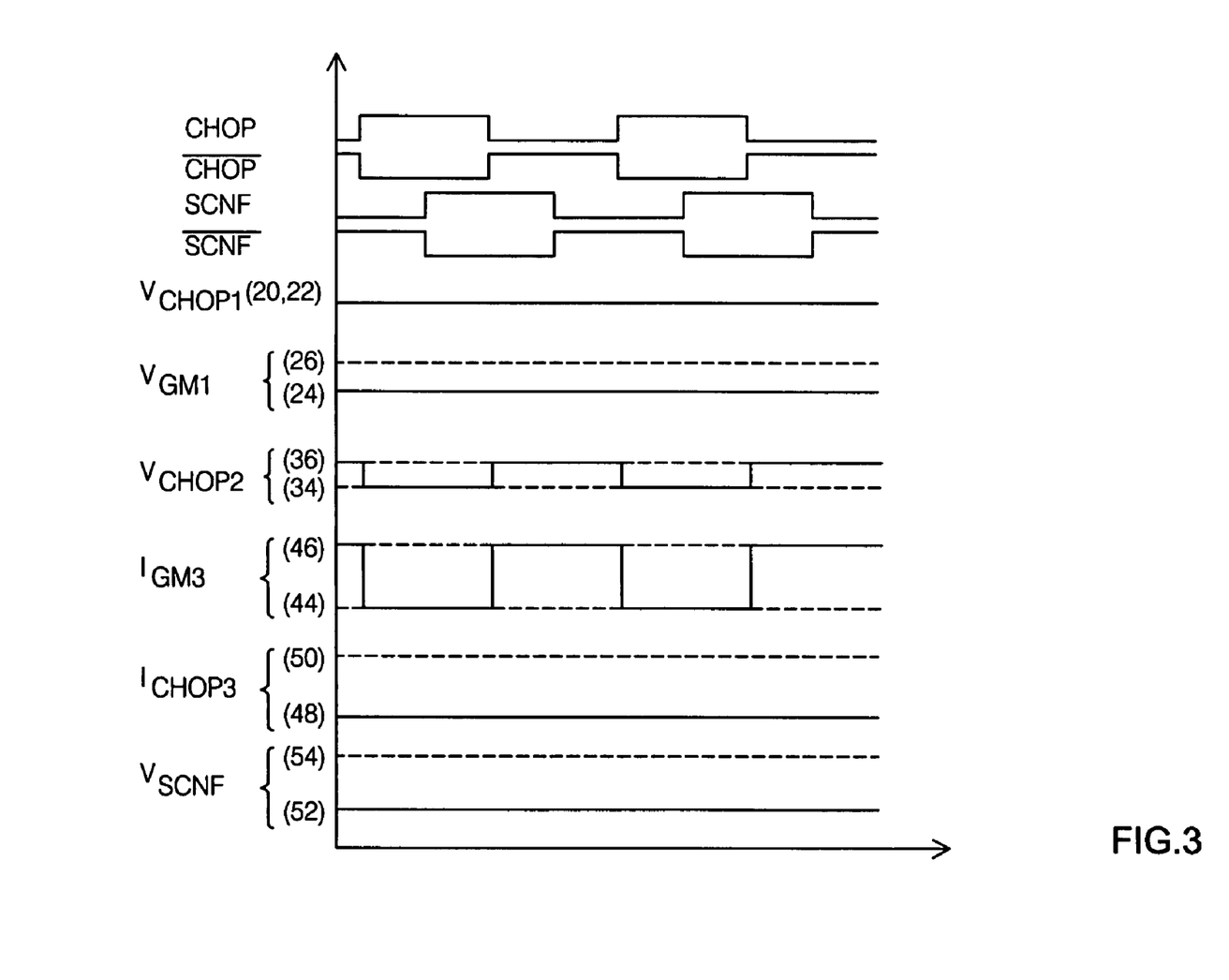
FIG. 3 is a timing diagram illustrating the operation of the amplifier without the benefit of the auto-correction feedback loop.
Figure 4:
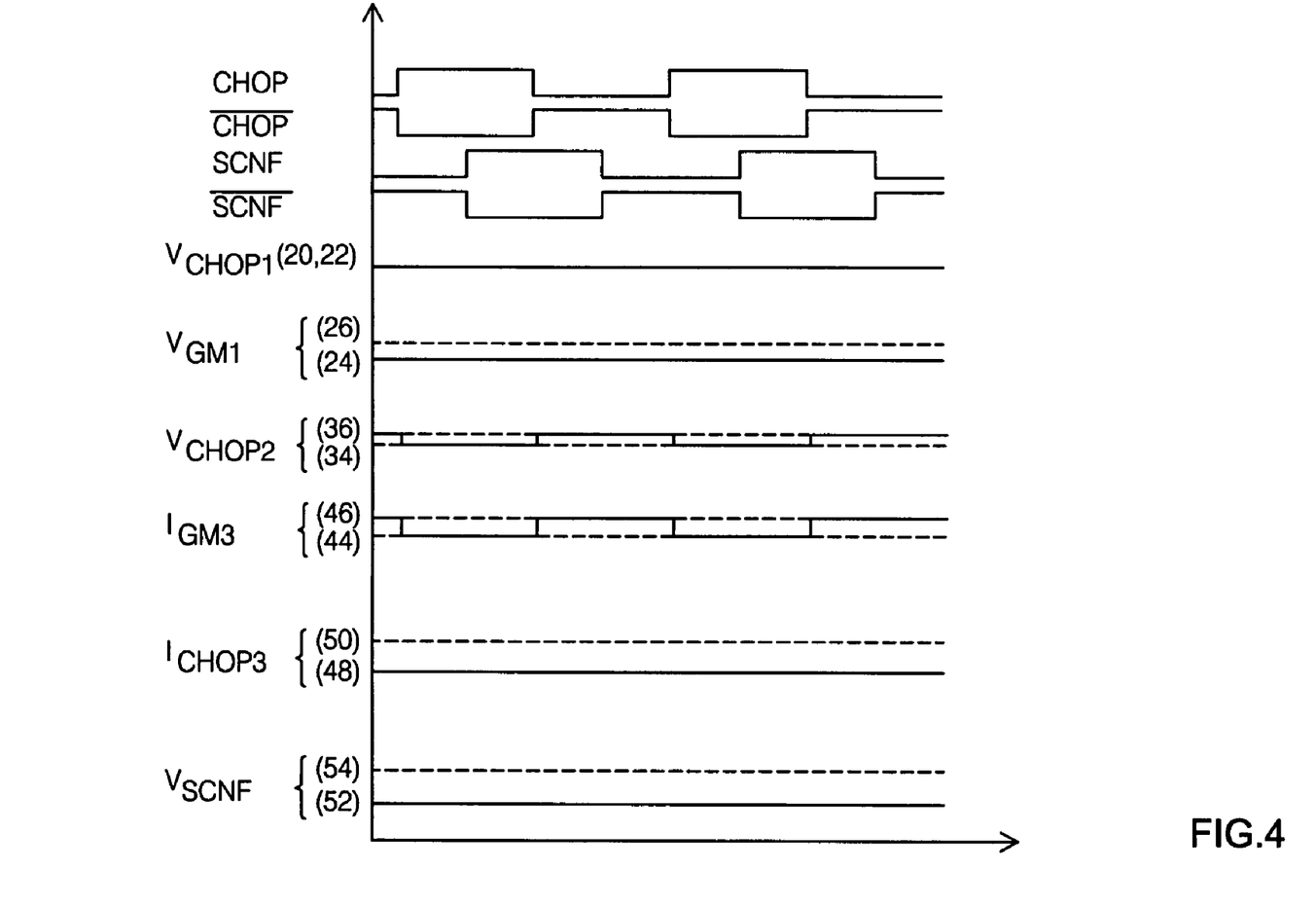
FIG. 4 is a timing diagram illustrating the operation of the amplifier and feedback loop when the first transconductance amplifier has a non-zero input offset voltage.
Figure 5:
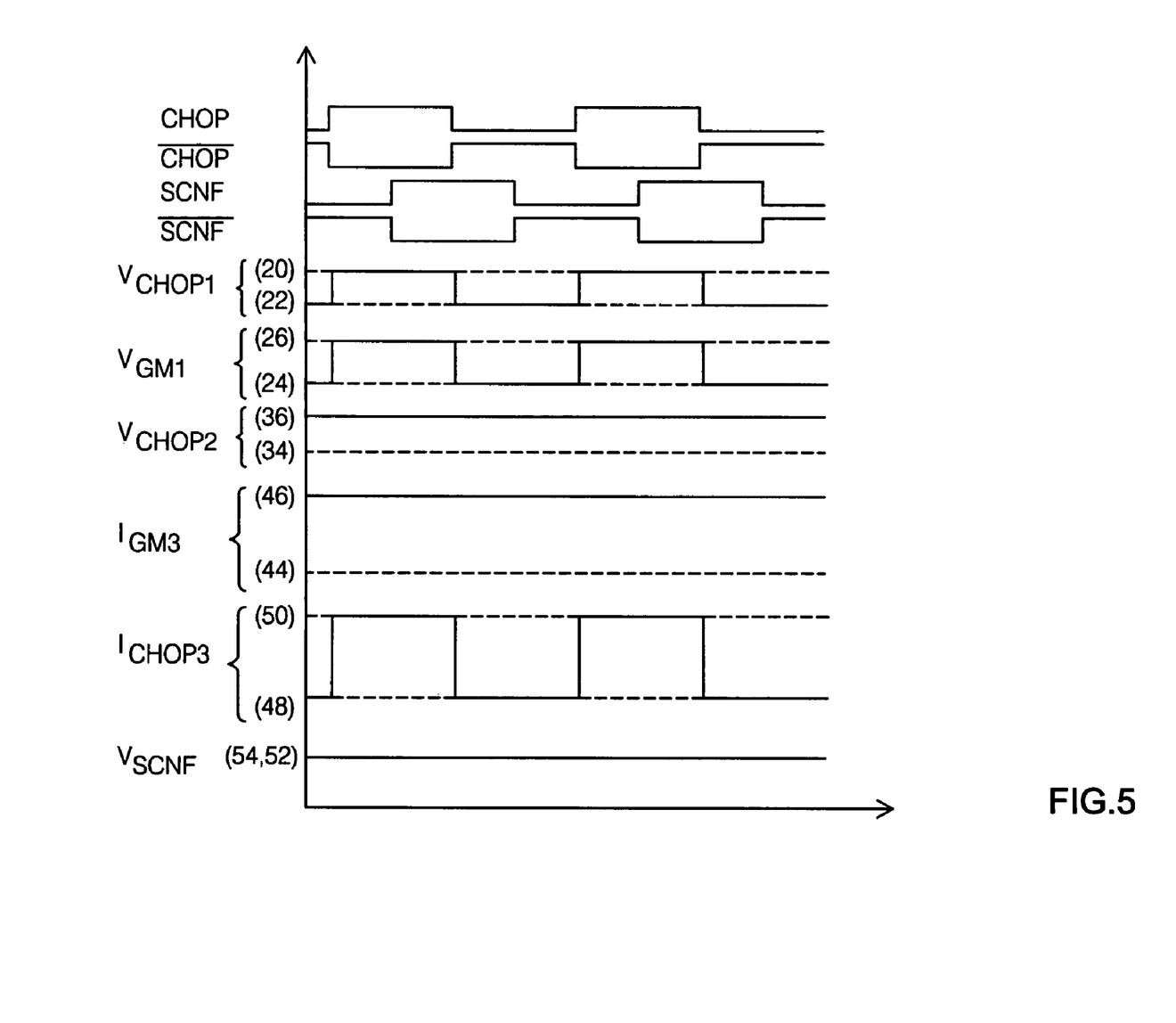
FIG. 5 is a timing diagram illustrating the operation of the amplifier and feedback loop when a non-zero differential input voltage is applied to the amplifier's input.

The operation of the present auto-correction feedback loop is illustrated for various operating conditions in FIGS. 3-5. FIG. 3 illustrates the operation of the circuit if the output (56, 58) of the feedback loop is not connected back into the signal path, both inputs to chopping circuit 14 are grounded, and there is an input offset voltage (Vos1) present at the inverting input of Gm1. Complementary chopping clock signals CHOP and $\overline{\text{CHOP}}$ are shown at the top of FIG. 3, with input terminals 16 and 18 connected to output terminals 20 and 22, respectively when CHOP is high, and input terminals 16 and 18 are connected to output terminals 22 and 20, respectively, when $\overline{\text{CHOP}}$ is high. Complementary clock signals SCNF and $\overline{\text{SCNF}}$ are also shown for reference; these might be used if filter 42 is a switched capacitor notch filter (discussed in more detail below).

Since the inputs to chopping circuit 14 are grounded, the voltage at its output terminals 20 and 22 ($V_{CHOP1}$) are both at zero volts. Gm1 will amplify offset voltage Vos1, resulting in a differential DC output voltage $V_{GM1}$ at the outputs 26, 24 of Gm1. $V_{GM1}$ is chopped by chopping circuit 32, thereby creating an AC voltage $V_{CHOP2}$ at output terminals 36, 34. The AC voltage is amplified by Gm3, resulting in an AC output current $I_{GM3}$ at outputs 46, 44. Chopping circuit 40 operates to convert the AC current to DC current $I_{CHOP3}$ at nodes 50, 48. This DC current is applied to filter 42, which outputs a corresponding output voltage $V_{SCNF}$.

In the timing diagram shown in FIG. 4, both inputs to chopping circuit 14 are again grounded, and an input offset voltage (Vos1) is again present at the inverting input of Gm1. Here, however, the feedback loop is closed as shown in FIG. 2, with the outputs 56, 58 of Gm4 coupled to the outputs 24, 26 of Gm1, respectively.

Since the inputs to chopping circuit 14 are grounded, the voltage at its output terminals 20 and 22 ($V_{CHOP1}$) are again both at zero volts. Gm1 will amplify offset voltage Vos1, resulting in a differential DC output voltage $V_{GM1}$ at the outputs 26, 24 of Gm1. However, due to the feedback provided by auto-correction feedback loop 12, the magnitude of $V_{GM1}$ is suppressed, such that it is less than it is in FIG. 3. $V_{GM1}$ is chopped by chopping circuit 32, thereby creating a small AC voltage $V_{CHOP2}$ at output terminals 36, 34. The AC voltage is amplified by Gm3, resulting in an AC output current $I_{GM3}$ at outputs 46, 44. Chopping circuit 40 operates to convert the AC current to DC current $I_{CHOP3}$ at nodes 50, 48. This DC current is applied to filter 42, which outputs a corresponding output voltage $V_{SCNF}$. This voltage is fed back into the main signal path at the output of Gm1, where it acts to suppress $V_{GM1}$. This has the effect of substantially reducing or eliminating offset voltages associated with transconductance amplifiers Gm1 and Gm4 and offset voltage-induced ripple and that might otherwise be present at the output of Gm2.

In essence, Gm3 operates to sense ripple caused by a non-zero differential DC voltage at the output of Gm1 and by chopping circuit 32, and creates a corresponding AC signal at its output. Chopping circuit 40 converts the AC signal back down to DC, which is fed back to Gm1's output through filter 42 and Gm4, thereby suppressing any DC signal at Gm1's output. To a first order, the added feedback loop does not affect the input signal ($V_{in}$) as long as $V_{in}$ is a DC signal, or changes slowly in comparison with the chopping frequency.

The timing diagram of FIG. 5 illustrates the operation of the present chopper-stabilized amplifier for a non-zero input voltage $V_{in}$, with no input offset voltages. The non-zero $V_{in}$ is converted to an AC voltage $V_{CHOP1}$ by chopping circuit 14. Gm1 amplifies the AC voltage, resulting in an AC voltage $V_{GM1}$ at the outputs 26, 24 of Gm1. $V_{GM1}$ is chopped by chopping circuit 32, thereby converting the AC voltage to a DC voltage $V_{CHOP2}$ at output terminals 36, 34. The DC voltage is amplified by Gm3, resulting in an DC output current $I_{GM3}$ at outputs 46, 44. Chopping circuit 40 operates to convert the DC current to an AC current $I_{CHOP3}$ at nodes 50, 48. This AC current is applied to filter 42, which operates to filter out the AC component of $I_{CHOP3}$, such that the voltages at the filter's output terminals are equal, and contain neither an AC or DC component. Providing this voltage as a feedback signal has no effect on the main signal path, which is the desired result, as there was no transconductance amplifier-related offset voltages or offset voltage-induced ripple present in the amplifier.

The auto-correction feedback loop also operates to mitigate input offset voltages associated with loop transconductance amplifiers Gm3 and Gm4. An input offset voltage associated with Gm3 is chopped and thereby converted to a high frequency AC component in the signal delivered to filter 42, which is then canceled or suppressed by filter 42 such that it has no effect on the main signal path. An input offset voltage associated with Gm4 is coupled to the output of Gm1 as a DC component, which would then be suppressed by the feedback loop in the same way as discussed above for an input offset voltage associated with Gm1, leaving only a residual DC signal at the output of Gm1 having a magnitude given by Vos4/A3, where Vos4 is Gm4's input offset voltage and A3 is the DC gain of Gm3. The feedback loop would also operate to suppress any DC error that originates with filter 42, due to, for example, capacitor mismatch or clock asymmetry.

As noted above, filter 42 is preferably a switched capacitor notch filter (SCNF), which is well-suited to reducing DC offset and its associated ripple as discussed above. However, other filter types, such as a low-pass filter (LPF), might also be used, though a LPF is less effective at eliminating chopping-related AC components in the signal being filtered, and may give rise to some residual errors. Either a switched capacitor LPF or a continuous time LPF could be used. A filter of some type is needed to distinguish between a signal which includes an undesirable input offset voltage-related ripple and a signal which represents the input voltage being amplified.

Figure 6:
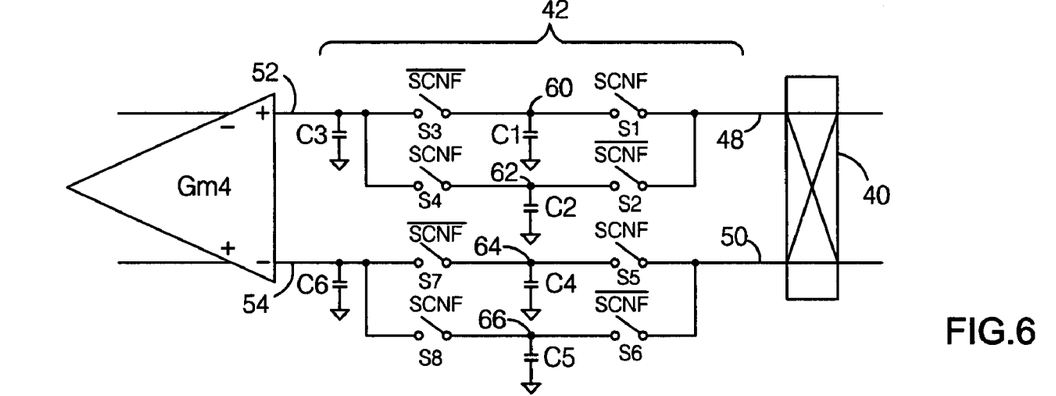
FIG. 6 is a schematic diagram of one possible embodiment of a switched capacitor notch filter as might be used in an auto-correction feedback loop per the present invention.
Figure 7:
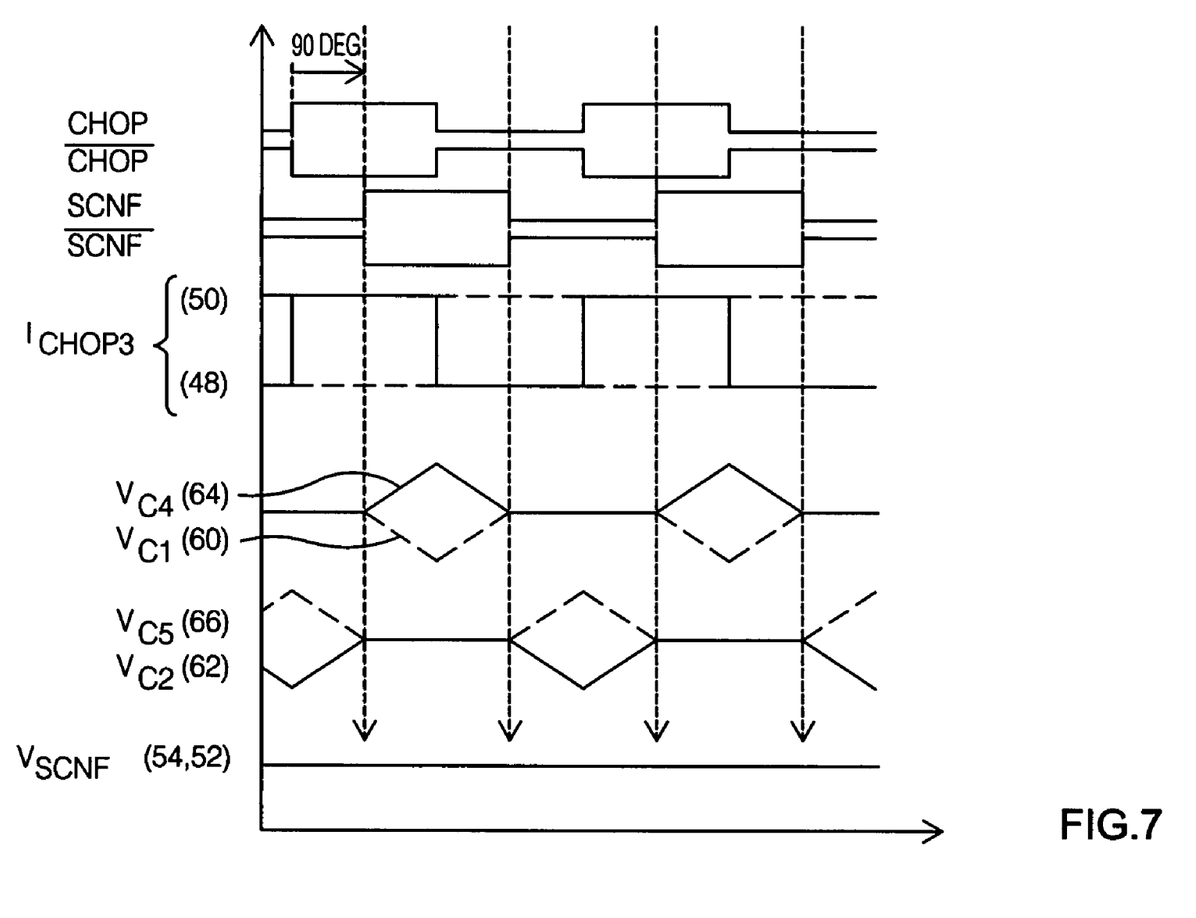
FIG. 7 is a timing diagram illustrating the operation of the switched capacitor notch filter shown in FIG. 6.

A preferred embodiment of a SCNF is shown in FIG. 6, and a timing diagram illustrating its operation is shown in FIG. 7. The filter includes a first branch connected to output 48 of chopping circuit 40, consisting of switches S1 and S2, which are operated by complementary SCNF clocks SCNF and $\overline{SCNF}$, respectively, with the output sides of S1 and S2 connected to the top of ground-referred capacitors C1 and C2 at nodes 60 and 62, respectively. Two switches S3 and S4 are connected to nodes 60 and 62 and operated by $\overline{SCNF}$ and SCNF, respectively, with their output sides connected to filter output node 52. Another capacitor, C3, is preferably connected between node 52 and ground.

The filter also includes a second branch connected to output 50 of chopping circuit 40, consisting of switches S5 and S6 operated by SCNF and $\overline{SCNF}$, respectively, with the output sides of S5 and S6 connected to the top of ground-referred capacitors C4 and C5 at nodes 64 and 66, respectively. Two switches S7 and S8 are connected to nodes 64 and 66 and operated by $\overline{SCNF}$ and SCNF, respectively, with their output sides connected to filter output node 54. Another capacitor, C6, is preferably connected between node 54 and ground.

As noted above, a switched capacitor notch filter is preferably clocked with a clock signal having the same frequency as, but which is phase-shifted 90 degrees with respect to, the chopping clock. Here, SCNF clocks SCNF and $\overline{SCNF}$ preferably toggle when the voltages at nodes 60 and 64 are equal, which occurs 90 degrees beyond the toggling of chopping clock signals CHOP and $\overline{CHOP}$. This creates a notch at the chopping frequency, enabling any offset voltage-induced AC component in the signal applied to the filter to be filtered out.

In operation, the current $I_{CHOP3}$ at the output of chopping circuit 40 is applied to the filter via switches S1, S2, S5 and S6 as operated by SCNF and $\overline{SCNF}$. This results in the AC triangle waveforms at nodes 64, 60, 66 and 62 as shown. For nodes 64 and 60, the voltages are sampled when SCNF goes low, and the sampled voltage is held until SCNF goes high again. The voltage difference held between nodes 64 and 60 is essentially zero, due to the 90 degree phase shift between the chopping clocks and the filter clocks.

For nodes 66 and 62, the voltages are sampled when $\overline{SCNF}$ goes low, and the sampled voltage is held until $\overline{SCNF}$ goes high again. As above, the voltage difference held between nodes 66 and 62 is essentially zero. This results in a voltage difference between the filter's output nodes (52, 54) of essentially zero, which is the desired result.

Figure 8:
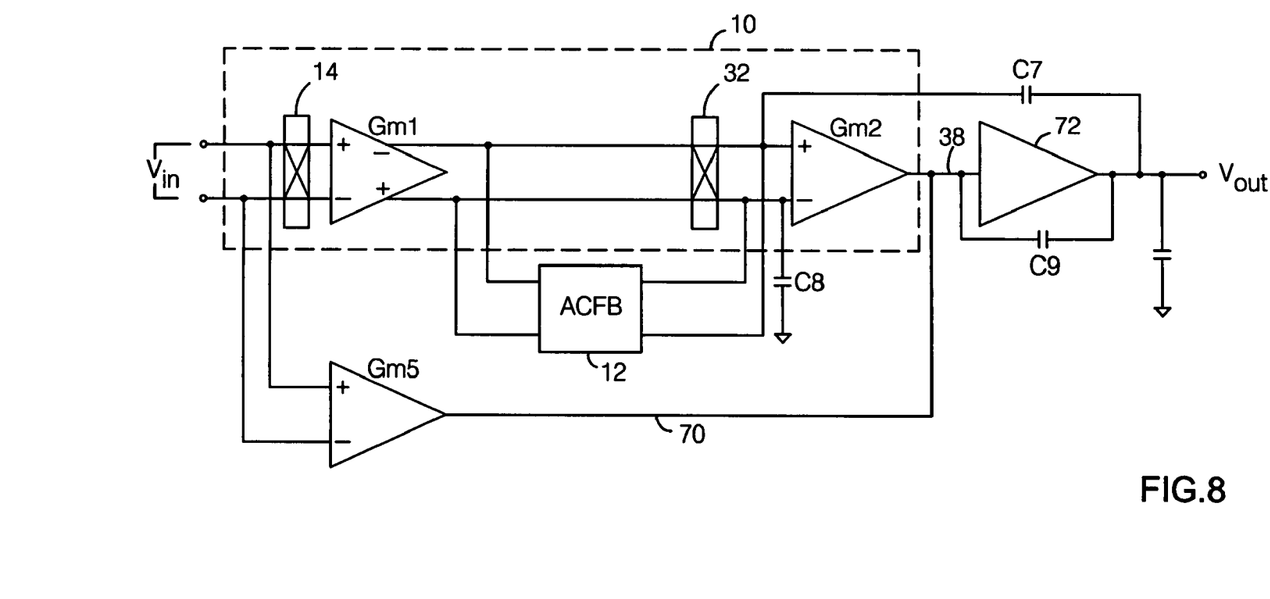
FIG. 8 is a block/schematic diagram showing a complete operational amplifier which includes a chopper-stabilized amplifier with an auto-correction feedback loop in accordance with the present invention.

As noted above, the output of Gm2 would typically be delivered to an output stage to form a complete chopper-stabilized op amp; one possible embodiment is shown in FIG. 8. Main signal path 10 and auto-correction feedback loop 12 are as before. A feedforward transconductance amplifier Gm5 is connected to receive $V_{in}$ at its differential input and to produce an output 70 which is coupled to the output 38 of Gm2; Gm5 helps to make the overall amplifier suitable for higher frequency input signals, while keeping its DC precision. A buffer amplifier 72 is connected to node 38 and produces an output which varies with its input; this output is the op amp's output $V_{out}$. Buffer amplifier 72 can be configured so as to provide a large gain for the op amp. A compensation network is used to provide frequency compensation for the chopper-stabilized op amp; in the exemplary embodiment shown, nested mirror compensation is employed, with a capacitor C7 connected between the output of buffer amplifier 72 and the non-inverting input of Gm2, a capacitor C8 connected between the inverting input of Gm2 and a circuit common point, and a capacitor C9 connected between the input and output of buffer amplifier 72.

The circuit arrangement shown in FIG. 8 enables an initial offset voltage associated with Gm2 or Gm5 to be suppressed by the voltage gain of Gm1. The total residual input-referred offset voltage (Vos_res) of the op amp is given by:

Vos_res=(Vos2+Vosf*Af/A2+Vos4/A3)/A1, where Vos2, Vosf and Vos4 are the initial offset voltages associated with Gm2, feedforward amplifier Gm5, and Gm4, respectively, and A1, A2, A3 and Af are the gain values associated with Gm1, Gm2, Gm3 and Gm5, respectively.

Figure 9:
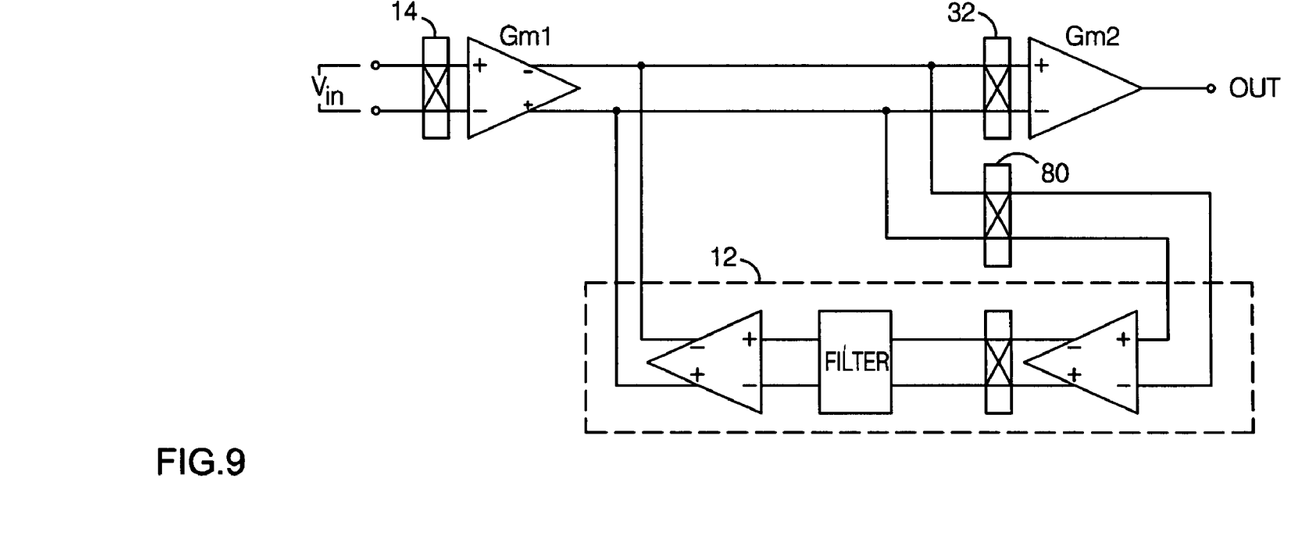
FIG. 9 is a schematic diagram of another possible embodiment of a chopper-stabilized amplifier with an auto-correction feedback loop in accordance with the present invention.

One possible alternative embodiment is shown in FIG. 9. Here, the input to auto-correction feedback loop 12 is taken at the output of Gm1, rather than at the output of chopping circuit 32. Doing this requires than an additional chopping circuit 80 be added between the output of Gm1 and the input to the feedback loop. This arrangement provides the same functionality as the configuration shown in FIG. 2, though at the expense of one additional chopping circuit.

Some prior art efforts attempt to reduce ripple by inserting a filter in the main signal path, which can make the amplifier susceptible to errors due to mismatches between the filter capacitances; in addition, glitches can appear in the amplifier's output via the compensation capacitor. In contrast, each of the embodiments described herein operates by using a feedback loop which includes a filter to suppress offset voltage and ripple voltage effects in the main signal path. This approach helps to provide immunity to mismatches in the notch filter capacitances (when an SCNF is used), and prevents ripple from being coupled to the amplifier's output via a compensation capacitor as occurs with some prior art designs.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A chopper-stabilized amplifier, comprising:
   a main signal path, comprising:
      an input chopping circuit which receives a differential input signal and chops said input signal in response to a chopping clock, said chopped input signal provided at said input chopping circuit's output;
      a first transconductance amplifier connected to receive said input chopping circuit's output at its input and to produce a first differential output which varies with its input;
      an output chopping circuit which receives the first differential output from said first transconductance amplifier and chops said first differential output in response to said chopping clock, said chopped first differential output signal provided at said output chopping circuit's output; and
      a second transconductance amplifier connected to receive said output chopping circuit's output at its input and to produce an output which varies with its input; and
   an auto-correction feedback loop, comprising:
      a third transconductance amplifier connected to receive said output chopping circuit's output at its input and to produce a third differential output which varies with its input;
      a third chopping circuit which receives the third differential output from said third transconductance amplifier and chops said third differential output in response to said chopping clock, said chopped third differential output signal provided at said third chopping circuit's output;
      a filter arranged to filter said third chopping circuit's output so as to substantially reduce the AC component present in said chopped third differential output signal and to provide said filtered version of said third chopping circuit's output at an output; and
      a fourth transconductance amplifier connected to receive said filtered version of said third chopping circuit's output at its input and to produce a fourth differential output which varies with its input, said fourth differential output coupled to said first differential output, said auto-correction feedback loop arranged to suppress transconductance amplifier-related offset voltages and offset voltage-induced ripple that might otherwise be present in said output chopping circuit's output.

2. The chopper-stabilized amplifier of claim 1, wherein said filter is a switched capacitor notch filter.

3. The chopper-stabilized amplifier of claim 2, wherein said switched capacitor notch filter is clocked with a clock which has the same frequency as said chopping clock and is phase-shifted 90 degrees with respect to said chopping clock.

4. The chopper-stabilized amplifier of claim 3, wherein said switched capacitor notch filter comprises:
   first and second input terminals and first and second output terminals;
   a first switch connected between said first input terminal and a first capacitance;
   a second switch connected between said first output terminal and said first capacitance;
   a third switch connected between said first input terminal and a second capacitance;
   a fourth switch connected between said first output terminal and said second capacitance;
   a fifth switch connected between said second input terminal and a third capacitance;
   a sixth switch connected between said second output terminal and said third capacitance;
   a seventh switch connected between said second input terminal and a fourth capacitance;
   an eighth switch connected between said second output terminal and said fourth capacitance;
   said switched capacitor notch filter clock comprising 'true' (SCNF) and 'complement' ($\overline{SCNF}$) versions, said first, fourth, fifth and eighth switches closed and said second third, sixth and seventh switches open when SCNF is high and $\overline{SCNF}$ is low, and said first, fourth, fifth and eighth switches open and said second third, sixth and seventh switches closed when $\overline{SCNF}$ is high and is SCNF is low.

5. The chopper-stabilized amplifier of claim 1, wherein said filter is a low-pass filter.

6. The chopper-stabilized amplifier of claim 1, further comprising:
   a feedforward transconductance amplifier connected to receive said differential input signal at its input and to produce an output which varies with its input and is coupled to the output of said second transconductance amplifier;
   a buffer amplifier connected to receive the output of said second transconductance amplifier at its input and to produce an output which varies with its input;
   a compensation network connected to provide frequency compensation for said chopper-stabilized amplifier.

7. The chopper-stabilized amplifier of claim 6, wherein said compensation network is a nested mirror compensation network.

8. The chopper-stabilized amplifier of claim 6, wherein said compensation network comprises:
  a first capacitor connected between the output of said buffer amplifier and one input of said second transconductance amplifier;
  a second capacitor connected between the other input of said second transconductance amplifier and a circuit common point; and
  a third capacitor connected between the input and output of said buffer amplifier.

9. The chopper-stabilized amplifier of claim 6, wherein said amplifier is arranged such that said amplifier's residual input-referred offset voltage (Vos_res) is given by:

$$Vos\_res=(Vos2+Vosf*Af/A2+Vos4/A3)/A1,$$

where Vos2, Vosf and Vos4 are the initial offset voltages associated with said second transconductance amplifier, said feedforward amplifier and said fourth transconductance amplifier, respectively, and A1, A2, A3 and Af are the gain values associated with said first, second, third and feedforward transconductance amplifiers, respectively.

10. The chopper-stabilized amplifier of claim 1, said amplifier arranged such that a DC offset voltage associated with said first transconductance amplifier appears as a non-zero DC voltage at the output of said first transconductance amplifier which is converted to an AC voltage by said output chopping circuit, said AC voltage amplified by said third transconductance amplifier and converted to a DC voltage by said third chopping circuit, said DC voltage fed back to said first differential output such that it suppresses the non-zero DC voltage at the output of said first transconductance amplifier induced by said DC offset voltage associated with said first transconductance amplifier.

11. The chopper-stabilized amplifier of claim 1, said amplifier arranged such that a DC offset voltage associated with said third transconductance amplifier appears as a non-zero DC voltage at the output of said third transconductance amplifier which is converted to an AC signal by said third chopping circuit, said filter arranged to filter said third chopping circuit's output so as to substantially reduce the magnitude of said AC signal present in said chopped third differential output signal due to said DC offset voltage.

12. The chopper-stabilized amplifier of claim 1, said amplifier arranged such that a DC offset voltage associated with said fourth transconductance amplifier or imperfections in said filter appears as a non-zero DC voltage at the output of said fourth transconductance amplifier, said auto-correction feedback loop arranged to suppress said non-zero DC voltage induced by said DC offset voltage or said imperfections in said filter.

\* \* \* \* \*